US006563175B2

(12) United States Patent
Shiau et al.

(10) Patent No.: US 6,563,175 B2
(45) Date of Patent: May 13, 2003

(54) NMOS ESD PROTECTION DEVICE WITH THIN SILICIDE AND METHODS FOR MAKING SAME

(75) Inventors: Wei-Tsun Shiau, Plano, TX (US); Craig T. Salling, Plano, TX (US); Jerry Che-Jen Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/961,615

(22) Filed: Sep. 24, 2001

(65) Prior Publication Data

US 2003/0057496 A1 Mar. 27, 2003

(51) Int. Cl.⁷ .............................................. H01L 23/62
(52) U.S. Cl. ...................... 257/355; 257/347; 257/344; 257/384; 257/401
(58) Field of Search ................................ 257/336, 357, 257/361, 355, 412, 413, 388, 500, 360, 344, 347, 382, 384, 401, 356, 358, 359; 438/133, 221, 309

(56) References Cited

U.S. PATENT DOCUMENTS

| | | | | |
|---|---|---|---|---|
| 4,717,684 A | * | 1/1988 | Katto et al. | 438/200 |
| 5,714,783 A | | 2/1998 | Duvvury | |
| 5,818,085 A | * | 10/1998 | Hsu et al. | 257/347 |
| 5,850,095 A | | 12/1998 | Chen et al. | |
| 5,897,348 A | * | 4/1999 | Wu | 438/200 |
| 5,939,753 A | * | 8/1999 | Ma et al. | 257/339 |
| 5,940,258 A | | 8/1999 | Duvvury | |
| 5,953,601 A | * | 9/1999 | Shiue et al. | 438/200 |
| 5,962,898 A | | 10/1999 | Duvvury | |
| 5,982,217 A | | 11/1999 | Chen et al. | |
| 5,990,504 A | * | 11/1999 | Morifuji | 257/270 |
| 6,110,771 A | * | 8/2000 | Ahn | 438/200 |
| 6,137,144 A | | 10/2000 | Tsao et al. | |
| 6,143,595 A | | 11/2000 | Hsu | |
| 6,147,538 A | | 11/2000 | Andresen et al. | |
| 6,156,593 A | * | 12/2000 | Peng et al. | 438/200 |
| 6,191,454 B1 | * | 2/2001 | Hirata et al. | 257/360 |
| 6,249,413 B1 | | 6/2001 | Duvvury | |
| 6,258,672 B1 | * | 7/2001 | Shih et al. | 438/275 |
| 6,278,160 B1 | * | 8/2001 | Park et al. | 257/377 |

OTHER PUBLICATIONS

"Non–uniform Bipolar conduction in Single Finger NMOS Transistors and Implications for Deep Submicron ESD Design", IRPS–International Reliability Physics Symposium Proceedings for the Year 2000, Kwang–Hoon Oh, Charvaka Duvvury, Craig Salling, Kaustav Banerjee and Robert W. Dutton, Published in 2000, 9 pgs.

"Process–related Effects on ESD Performance in Deep Submicron Technologies", Ajith Amerasekera and Vikas Gupta, Published date not available, 10 pgs.

"Development of Substrate–Pumped nMOS Protection for a 0.13um Technology", Craig Salling, Jerry Hu, Jeff Wu, Charvaka Duvvury, Roger Cline and Rith Pok, Published date not available, 13 pgs.

(List continued on next page.)

Primary Examiner—Steven Loke
Assistant Examiner—Quang Vu
(74) Attorney, Agent, or Firm—Yingsheng Tung; Wade James Brady, III; Frederick J. Telecky, Jr.

(57) ABSTRACT

An NMOS ESD clamping device and methods for making the same are disclosed in which the device includes N type drain and source regions formed in a semiconductor substrate and a gate overlying a P-type channel region in the substrate between the source and drain regions. A first silicide region is formed in the drain and/or the source region with a first thickness. A second thin silicide region is formed in the substrate between the gate and the drain having a second thickness less than the first thickness, wherein the thin silicide increases the ESD current clamping capability of the device to provide improved ESD circuit protection.

15 Claims, 10 Drawing Sheets

OTHER PUBLICATIONS

"ESD–related Process Effects in Mixed–voltage Sub–0.5um Technologies", Vikas Gupta, Ajith Amerasekera, Sridhar Ramaswamy and Alwin Tsao, Published date not available, 9 pgs.

"Substrate Triggering and Salicide Effects on ESD Performance and Protection Circuit Design in Deep Submicron CMOS Processes", IEEE Electron Device Meeting Technical Digest, Ajith Amerasekera, Charvaka Duvvury, Vijay Reddy and Mark Rodder, 1995, pp. 547–550.

"A Novel NMOS Transistor for High Performance ESD Protection Devices in 0.18 um CMOS Technology Utilizing Salicide Process", EOS/ESD Symposium 00, Chang–Su Kim, Hong–Bae Park, Young–Gwan Kim, Dae–Gwan, Kang, Myoung–Goo Lee, Si–Woo Lee, Chan–Hee Jeon, Han–Gu Kim, Young–Jae Yoo and Han–Sub Yoon, pp. 407–412.

* cited by examiner

NMOS ESD PROTECTION DEVICE WITH THIN SILICIDE AND METHODS FOR MAKING SAME

FIELD OF INVENTION

The present invention relates generally to the art of semiconductor devices and more particularly to improved NMOS devices with thin silicide for improved ESD protection in integrated circuit devices.

BACKGROUND OF THE INVENTION

Electrostatic discharge. (ESD) is a continuing problem in the design and manufacture of semiconductor devices. Integrated circuits (ICs) can be damaged by ESD events stemming from a variety of sources, in which large currents flow through the device. In one such ESD event, a packaged IC acquires a charge when it is held by a human whose body is electrostatically charged. An ESD event occurs when the IC is inserted into a socket, and one or more of the pins of the IC package touch the grounded contacts of the socket. This type of event is known as a human body model (HBM) ESD stress. For example, a charge of about 0.6 μC can be induced on a body capacitance of 150 pF, leading to electrostatic potentials of 4 kV or greater. HBM ESD events can result in a discharge for about 100 nS with peak currents of several amperes to the IC. Another source of ESD is from metallic objects, known as the machine model (MM) ESD source, which is characterized by a greater capacitance and lower internal resistance than the HBM ESD source. The MM ESD model can result in ESD transients with significantly higher rise times than the HBM,ESD source. A third ESD model is the charged device model (CDM), which involves situations where an IC becomes charged and discharges to ground. In this model, the ESD discharge current flows in the opposite direction in the IC than that of the HBM ESD source and the MM ESD source. CDM pulses also typically have very fast rise times compared to the HBM ESD source.

ESD events typically involve discharge of current between one or more pins or pads exposed to the outside of an integrated circuit chip. Such ESD current flows from the pad to ground through vulnerable circuitry in the IC, which may not be designed to carry such currents. Many ESD protection techniques have been thusfar employed to reduce or mitigate the adverse effects of ESD events in integrated circuit devices. Many conventional ESD protection schemes for ICs employ peripheral dedicated circuits to carry the ESD currents from the pin or pad of the device to ground by providing a low, impedance path thereto. In this way, the ESD currents flow through the protection circuitry, rather than through the more susceptible circuits in the chip.

Such protection circuitry is typically connected to I/O and other pins or pads on the IC, wherein the pads further provide the normal circuit connections for which the IC was designed. Some ESD protection circuits carry ESD currents directly to ground, and others provide the ESD current to the supply rail of the IC for subsequent routing to ground. Rail-based clamping devices can be employed to provide a bypass path from the IC pad to the supply rail (e.g., VDD) of the device. Thereafter, circuitry associated with powering the chip is used to provide such ESD currents to the ground. Local clamps are more common, wherein the ESD currents are provided directly to ground from the pad or pin associated with the ESD event. Individual local clamps are typically provided at each pin on an IC, with the exception of the ground pin or pins.

One common technique for creating local clamping devices for protection of metal-oxide semiconductor (MOS) ICs is to create an N-channel MOS transistor device (NMOS), in which a parasitic bipolar transistor (e.g., a lateral NPN, or LNPN) associated with the NMOS clamp device turns on to conduct ESD currents from the pad to ground. The bipolar transistor is formed from the NMOS device, wherein the P-type doped channel between the drain and source acts as the NPN base, and the N-type drain and source act as the bipolar collector and emitter, respectively. Typically, the drain of the NMOS clamp is connected to the pad or pin to be protected and the source and gate are tied to ground. Current flowing through the substrate to ground creates a base to emitter voltage (Vbe) sufficient to turn on the bipolar device, whereby further ESD current flows from the drain (collector) at the pad to the grounded source (emitter).

The parasitic bipolar transistor (LNPN) operates in a snapback region when the ESD event brings the potential of the pad or pin positive with respect to ground. In order to provide effective ESD protection, it is desirable to provide an LNPN having a low trigger voltage to begin snapback operation, as well as a high ESD current capability within the snapback region. In practice, the LNPN enters the snapback region of operation upon reaching an initial trigger voltage Vt1 having a corresponding current It1. Thereafter, the LNPN conducts ESD current to ground to protect other circuitry in the IC, so long as the ESD current does not exceed a second breakdown current level It2 with a corresponding voltage Vt2. If the ESD stress currents exceed It2, thermal runaway is induced in the protective clamp device, wherein the reduction of the impact ionization current is offset by the thermal generation of carriers. This breakdown is initiated in a device under stress as a result of self-heating, and causes failure of the ESD clamping device, allowing ESD currents to damage other circuitry in the IC. To avoid such ESD clamp device failure and the associated IC damage, it is therefore desirable to provide LNPN clamping devices having high It2 breakdown current ratings.

Because the NMOS transistor and associated LNPN are designed for relatively large current conduction, such devices typically include multiple fingers for each of the drain, source, and gate. One problem with such multi-finger devices is found where Vt1 is greater than Vt2. In this situation, one finger of the device may turn on, causing operation of a portion of the device to operate in snapback mode. Thereafter, the remaining fingers may not reach Vt1 due to the snapback operation of the first finger. As a result, the full ESD current conduction capability for the LNPN is not utilized, and the current may exceed breakdown levels for the fingers operating in the snapback region, resulting in thermal device failure. Accordingly, it is desirable to provide multi-finger LNPNs having Vt2 greater than Vt1 to ensure all the fingers transition into the snapback region in a predictable fashion and thereby to avoid such unintended ESD protection device failure.

Many circuits have been proposed and implemented for protecting ICs from ESD. One method that is used to improve ESD protection for ICs is biasing the substrate of ESD protection circuits on an IC. Such substrate biasing can be effective at improving the response of a multi-finger NMOS transistor that is used to conduct an ESD discharge to ground. However, substrate biasing can cause the threshold voltages for devices to change from their nominal values, which may affect device operation. In addition, substrate biasing under steady-state conditions causes heat generation and increases power losses in the IC. Thus, although substrate biasing may increase the response of ESD protection of multi-finger MOS transistors, the additional problems caused by substrate biasing may limit its effectiveness or applicability. Thus, there remains a need for improved ESD clamping devices having high current capability for protecting ICs from damage or failure during ESD events, and which provide for increased It2 capacity.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

The present invention relates to ESD protection circuitry and methods for making such. In particular NMOS transistors are provided having parasitic bipolar LNPNs associated therewith, for use in local or rail-based ESD clamping applications. It has been found that thinner silicide in the drain (e.g., and/or in the source) of the NMOS increases the It2 breakdown current level. The invention provides increased It2 current capabilities for such devices through selective employment of thin silicide in the drain and/or source regions of the NMOS transistor. In addition, the thin silicide provides adjustable drain and/or source resistance by which Vt2 can be made greater than Vt1. Thus, the invention can be employed to provide improved ESD current clamping capability, as well as improved reliability of multi-finger NMOS clamping devices.

One aspect of the invention provides an NMOS ESD clamping device for protecting an integrated circuit from an ESD event, with N-type drain and source regions formed in a semiconductor substrate and a gate overlying a P-type channel region between the source and drain regions. A first silicide region is formed in the drain and/or the source region with a first thickness, and a thin second silicide region is formed between the gate and the drain, and/or between the gate and the source. The second silicide is thinner than the first silicide, by which the It2 of the NMOS device can be increased. The selective application of the thin silicide improves (e.g., increases) It2 and/or allows relative adjustment of Vt1 and Vt2 in the ESD protection device, while allowing thicker silicide to be employed elsewhere in the IC. Thus, for example, the gate silicide in other devices in the IC can remain thick to achieve low gate resistance, while one or more silicide regions associated with the ESD protection devices can be made thinner.

The silicide thickness can be controlled using masking techniques, wherein polysilicon masks are formed around the regions where the thin silicide is desired. For example, polysilicon islands or dummy gates can be formed, which are narrowly spaced from the polysilicon gate fingers of the NMOS device. A silicide-forming metal, for example, such as cobalt, a silicide-forming metal, or nickel is then deposited, which is usually done via sputtering. The narrow spacings or gaps between the adjacent polysilicon regions results in reduction in the amount of silicide-forming metal deposition in the narrow gaps, due to the nature of the silicide-forming metal deposition. The reduction in the amount of silicide-forming metal in the narrow gaps, in turn, provides for thinner silicide in the gaps after subsequent reaction of the deposited metal with silicon to form silicide.

Thus, the use of polysilicon masking can provide for selective formation of thin silicide for ESD clamping devices, while allowing a single metal deposition/reaction process to be employed throughout the IC, to provide thicker silicide in non-ESD related areas or regions of the device.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 1b is a sectional side elevation view illustrating an NMOS transistor and associated lateral bipolar NPN (LNPN) transistor operating as the ESD clamp of FIG. 1a;

FIG. 3b is a sectional side elevation view of the NMOS device taken along line 3b—3b of FIG. 3a;

FIG. 4b is a sectional side elevation view illustrating the NMOS device taken along line 4b—4b of FIG. 4a;

FIG. 4c is a sectional side elevation view illustrating the NMOS device taken along line 4c—4c of FIG. 4a;

DETAILED DESCRIPTION OF THE INVENTION

Figure 1A:
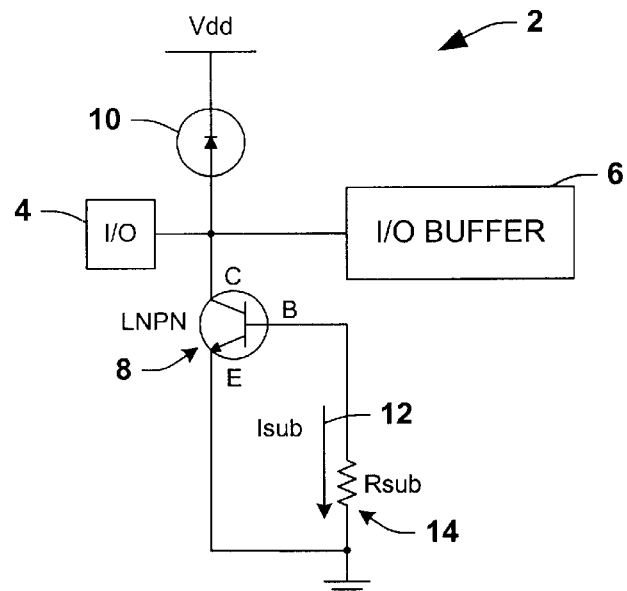
FIG. 1a is a schematic diagram illustrating an I/O pin of an integrated circuit device having an ESD clamp for protection of the device during an ESD event.

The present invention will now be described with reference to the attached drawings, wherein like reference numerals are used to refer to like elements throughout. The invention relates to ESD protection devices, such as NMOS devices with associated LNPNs, where thin silicide is selectively employed to improve It2 and/or to allow advantageous adjustment of Vt2 with respect to Vt1. Masking structures, such as polysilicon dummy gates or islands, can be provided proximate the gate or other polysilicon features, such that silicide-forming metal deposition depths are controlled in localized regions, resulting in thin silicide formation during sintering. Although examples of one or more applications of the present invention are hereinafter illustrated and described, it will be appreciated that other applications and implementations not illustrated or described herein fall within the scope of the present invention and the appended claims.

Referring initially to FIG. 1a, a portion of an integrated circuit 2 is illustrated schematically with an I/O pad 4 for connection of an I/O buffer circuit 6 with external devices or circuitry (not shown). An ESD protection LNPN 8 is provided, acting as a local clamp device to conduct ESD currents from the pad 4 to ground. A diode 10 may optionally be included to provide ESD currents to a power supply rail Vdd in combination with the local clamp LNPN 8. During an ESD event, a substrate current Isub 12 flows from the collector C of the LNPN 8 through a substrate resistance Rsub 14, thereby creating a base voltage Vbe at the base B and turning the LNPN 8 on. The LNPN 8 then conducts ESD current from the pad 4 at collector C to the grounded emitter E in snapback operation to protect the I/O buffer 6 and other circuitry in the IC 2 from ESD damage.

Figure 1B:
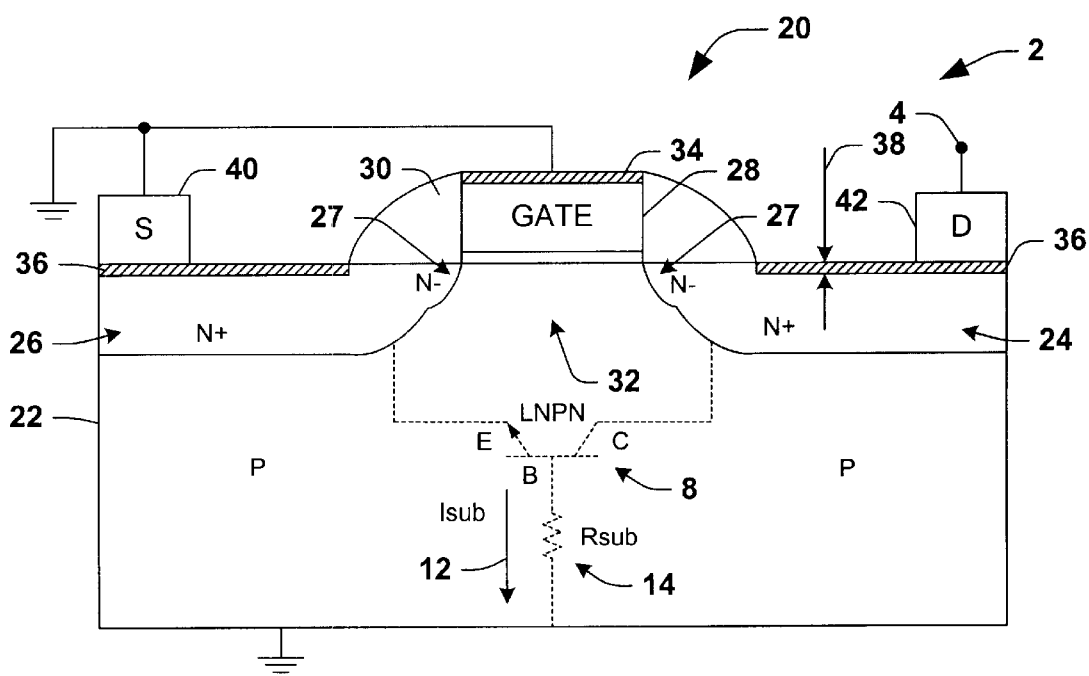

As further illustrated in FIG. 1b, the LNPN 8 (illustrated in dashed lines) is formed from portions of an NMOS transistor 20. The NMOS 20 is formed from a substrate 22 doped with P-type dopants, in which N-type drain and source regions 24 and 26 are created, respectively. For example, the regions 24 and 26 are implanted in the substrate 22 with N+ dopants and may further comprise lightly doped (e.g., N−) areas 27 partially underlying a gate 28. The gate 28 comprises a polysilicon structure 30 overlying a P-type channel region 32 in the substrate between the drain and source regions 24 and 26. The gate 28 includes a silicide region 34 by which the gate 28 is grounded. The upper portions of the drain and source regions 24 and 26 also include silicide regions 36, wherein the silicide 36 and 34 have a thickness 38. The source region 26 is grounded through the silicide 36 and a contact 40, and the drain region 24 is connected to the pad 4 (FIG. 1a) via a contact 42.

The lateral NPN bipolar transistor (LNPN) 8 of FIG. 1a is formed from the NMOS device 20, wherein the N-type drain region 24 acts as the collector C, the N-type source region 26 functions as the emitter E, and the P type channel region 32 therebetween functions as the base B of the LNPN 8. During an ESD event, ESD current travels from the drain contact 42, at the pad 4, through the substrate 22 toward the ground, creating the substrate current Isub 12. This current Isub 12; in turn, causes a voltage across the substrate resistance Rsub 14 which turns on the bipolar LNPN 8.

It has been found that decreasing the silicide thickness 38 at the drain 24 can advantageously allow more ESD current through the drain region 24 for passage to ground through the LNPN 8, to thereby increase the It2 associated with the clamp 20. Alternatively or in combination, decreasing the silicide thickness 38 at the source 26 can improve the ESD protection capabilities of the device 20 for the same reason. Furthermore, the decrease in the silicide thickness 38 in the drain 24 or source 26 can further provide for adjustability of the voltages Vt1 and Vt2, as illustrated and described in further detail hereinafter with respect to FIGS. 2a and 2b. For instance, in the local ESD clamp device 20, decreasing the silicide thickness 38 near the drain region 24 can ensure that Vt2 is greater than Vt1, whereby proper turn on of all fingers in a multi-finger NMOS protection device can be facilitated in accordance with the present invention.

Figure 2A:
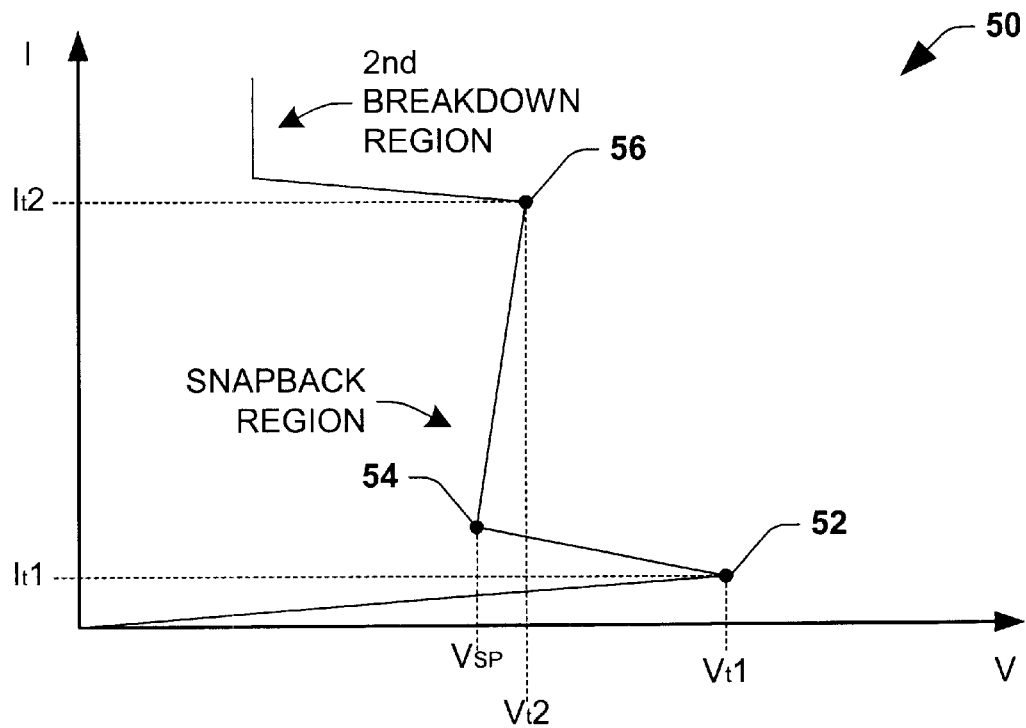
FIG. 2a is a graph illustrating an I-V curve for an NMOS ESD clamp having snapback and breakdown regions.
Figure 2B:
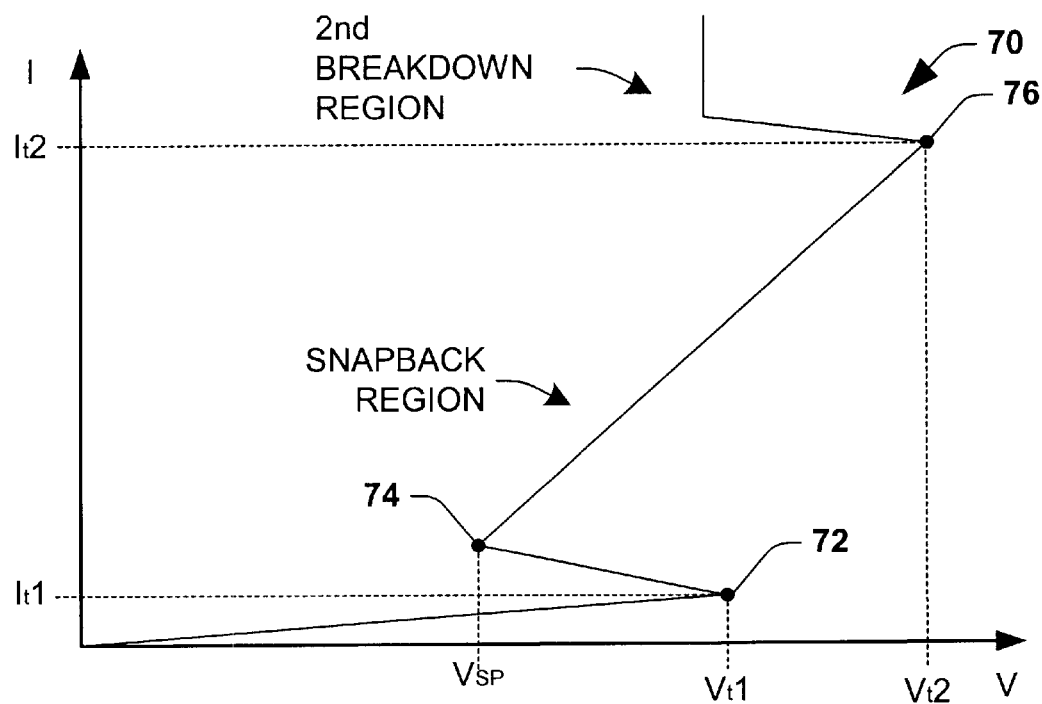
FIG. 2b is a graph illustrating another I-V curve for an NMOS ESD clamp having snapback and breakdown regions.

FIGS. 2a and 2b illustrate current vs. voltage curves 50 and 70, respectively, for NMOS ESD clamp devices where an associated LNPN operates to conduct ESD currents in a snapback region, and undergoes thermal failure if operated in a second breakdown region. In FIG. 2a, the LNPN (e.g., LNPN 8 of FIGS. 1a and 1b) conducts along the curve 50 until an initial trigger voltage Vt1 52 (e.g., the drain-to-source voltage of the ESD clamp 20) is reached at a current of It1, after which the voltage drops to a snapback voltage Vsp 54. The device then conducts ESD currents up to a current level It2 at corresponding voltage Vt2 56, after which the device enters a second breakdown region where thermal breakdown occurs. The device therefore provides ESD protection for currents below It2. Accordingly, it is desirable to maximize It2 in such protection devices. In the curve 50 of FIG. 2a, it is noted that the voltage level Vt1 52 is greater than Vt2 56. As discussed above, this situation can cause undesirable operation of ESD clamps having multi-finger architectures, wherein one or more fingers of the device fail to enter the snapback region by virtue of other fingers entering snapback. It is thus further desired to provide a device wherein Vt2 is greater than Vt1.

Referring now to FIG. 2b, another I-V curve 70 is illustrated in which the LNPN conducts until an initial trigger voltage Vt1 72 is reached at a current of It1, after which the voltage drops to a snapback voltage Vsp 74. The device then conducts ESD currents up to a current level It2 at corresponding voltage Vt2 76, after which the device enters a second breakdown region where thermal breakdown occurs. When the NMOS operates in the snapback mode or the bipolar breakdown region, the LNPN conducts most of the drain terminal current. It has been found that It2 depends on the Beta or gain of the LNPN, the NMOS channel region length, the silicide thickness, and the drain junction depth. In particular, the It2 has been found to increase with a decrease in the silicide thickness. However, decreasing the silicide thickness for non-ESD devices throughout the IC can cause reduced performance; such as where gate resistance increases.

In accordance with the present invention, and as illustrated and described below, drain and/or source region silicide thickness may be selectively reduced in order to increase It2 76 above the corresponding It2 56 of curve 50 (FIG. 2a). In addition, the thin silicide according to the invention may be used to set Vt2 76 higher than Vt1 72, as shown in FIG. 2b. From the curves 50 and 70 of FIGS. 2a and 2b, respectively, it is seen that an ESD clamp device having performance according to curve 70 provides protection against higher ESD currents than a device corresponding with curve 50. Moreover, because Vt2 76 is greater than Vt1 72 in curve 70, a corresponding multi-finger protection device is more likely to have all fingers thereof operate in the snapback region. Uniformity in turning on the LNPNs (or NMOS fingers) can be achieved by increasing snapback on-resistance (Ron) to increase Vt2 to being greater than Vt1 or by reducing Vt1 to being less than Vt2. If Vt1 is designed to be lower than Vt2, each LNPN of a NMOS finger would, during an ESD event, turn on to conduct the ESD current before any single LNPN reaches second breakdown, Vt2.

Figure 3A:
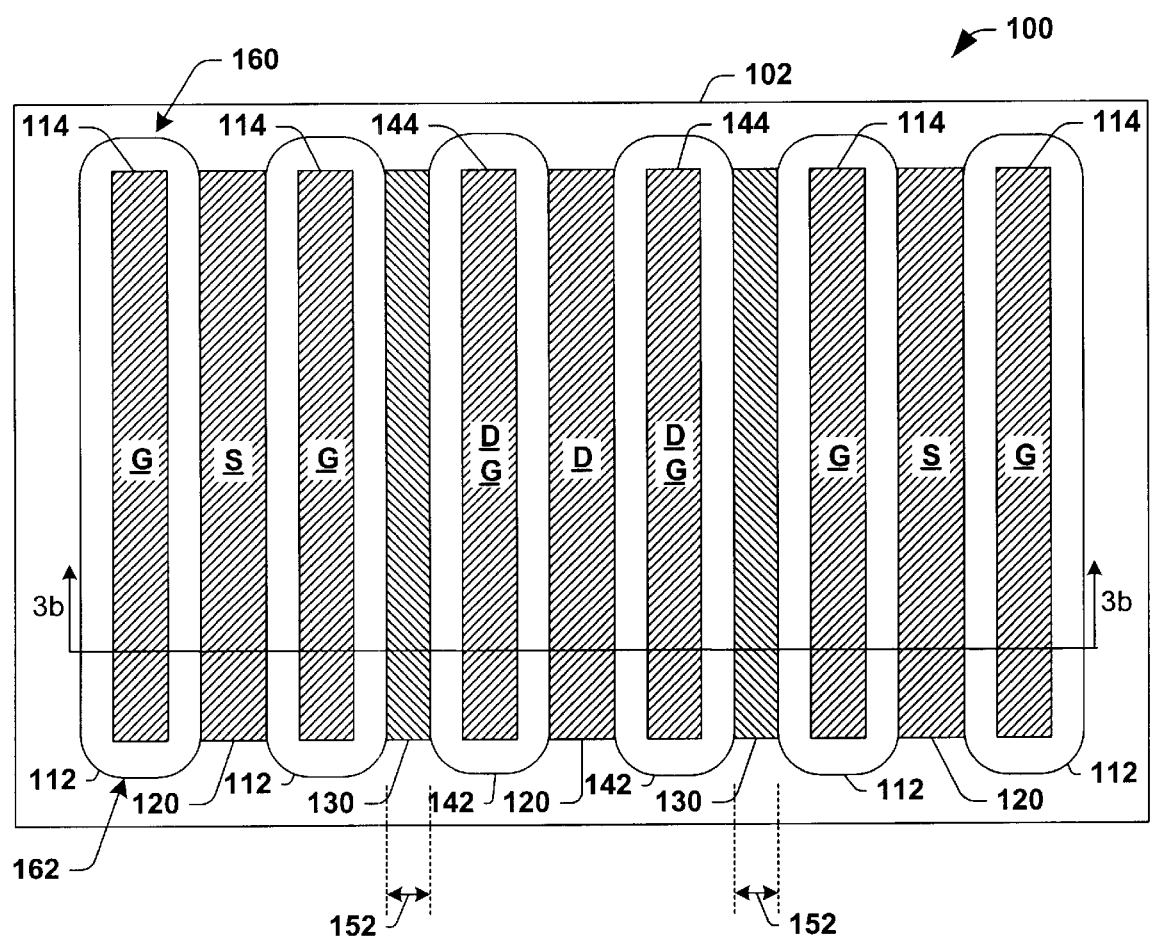
FIG. 3a is a top plan view illustrating a portion of an exemplary NMOS ESD device in accordance with an aspect of the present invention.
Figure 3B:
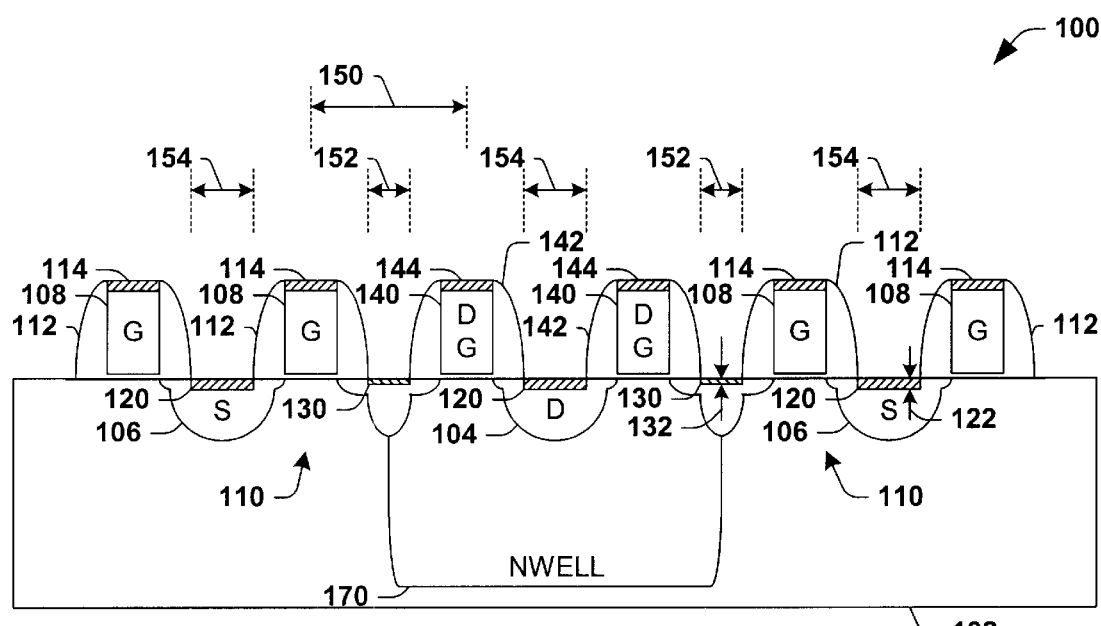

Referring now to FIGS. 3a and 3b, a portion of an exemplary multi-finger NMOS ESD protection device 100 is illustrated, in which the device 100 is constructed from a substrate 102, such as silicon doped with P-type dopant. The device 100 comprises one or more N-type drain and source regions 104 and 106, respectively, formed in the P-type semiconductor substrate 102, as well as one or more gates 108 overlying P-type channel regions 110 in the substrate 102 between the drain and source regions 104 and 106. First silicide regions 120 are formed in the drain and source regions 104 and 106, having a first thickness 122 of about 30 nm or more to form low resistance drain and source contacts, respectively. The device 100 is an exemplary implementation of one or more aspects of the invention, wherein second silicide regions 130 are formed in the substrate 102 between the gates 108 and the drain region 104. The second silicide regions 130 are thinner than the first silicide regions 120, having a second thickness 132, which is less than the thickness 122. For example, in the illustrated device 100, the thin suicide thickness 132 is about 13 nm or more and about 25 nm or less, such as about 13 nm.

The gates 108 comprise first polysilicon structures 112 and conductive contacts 114, wherein the structures 112 overlying the channel regions 110. The device 100 also includes dummy gates 140 comprising second polysilicon structures 142 on the substrate 100 and contacts 144, wherein the first and second polysilicon structures 112 and 142 can be advantageously employed to mask silicide-forming metal deposition in order to facilitate creation of the thin silicide regions 130, as will be discussed in greater detail below. The polysilicon structures 112 and 142 and other polysilicon structures referred to herein may, but need not comprise insulative sidewall spacers (e.g., such as nitride) forming the sidewalls thereof, which can be used in creating lightly doped drain (LDD) or extension regions in the drain and/or source regions 104 and 106. The polysilicon structures 142 partially overly the drain region 104 between the gates 108 and the drain region 104. It will be noted at this point that while the illustrated implementations comprise thin silicide regions, such as regions 130 of FIGS. 3a and 3b between the gate and drain, other implementations are contemplated as falling within the scope of the present invention, such as where such thin silicide regions are provided, alternatively or in combination, between the gate and source regions. In such implementations, for example, second polysilicon structures can be formed accordingly between the gate structure and the source regions for silicide masking purposes in accordance with the invention.

As further illustrated in FIGS. 5a–5d and described below, the spacings 152, 154 between such polysilicon structures 112, 142 can be employed to achieve selective control over the suicide thicknesses 122 and 132, and in particular, to provide thin silicide regions 130 and thicker silicide regions 120 using the same silicide-forming metal deposition and tempering operations. In this regard, the polysilicon regions 112 and 142 of FIGS. 3a and 3b are spaced (e.g., center to center) by a distance 150 of about 270 nm or less to provide gaps of distance 152 therebetween, wherein the gap distances 152 are about 50 nm or less. Larger gap distances 154 are provided between adjacent first polysilicon structures 112 for the gates 108 and between adjacent second structures 142 for the dummy gates 140.

As illustrated in FIG. 3a, the first polysilicon structures 112 extend, for example, along a width of the device 100 between first and second ends 160 and 162, respectively, and between the source and drain regions 106 and 104, respectively. It will be appreciated in this regard, that the device 100 may comprise more fingers than those illustrated in FIGS. 3a and 3b, for instance, wherein additional drain regions 104 are situated laterally outside of the left most and/or the right most structures 112. Furthermore, the second polysilicon structures 142 extend along the width of the device between the ends 160, 162 and between the first polysilicon structures 112 and the drain region 104. The device 100 further comprises an N-type well (NWELL) 170 underlying the dummy gate structures 142 and the drain region 104 to connect the stripes of thin silicide 130 to the drain region 104. The inclusion of the thin silicide 130 adds to the portion of the device drain 104 which avalanches during an ESD event. This increase allows more current to flow, and hence increases the effective It2 of the device 100.

Figure 4A:
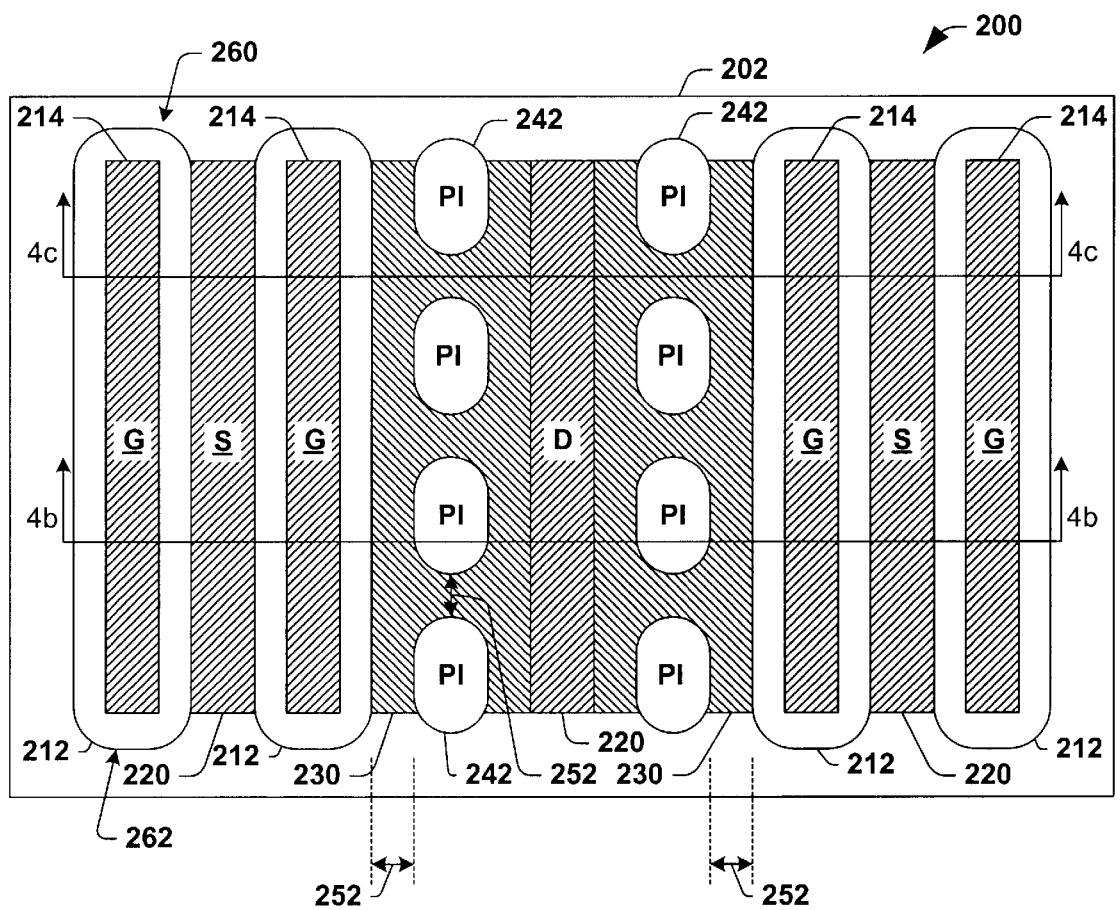
FIG. 4a is a top plan view illustrating a portion of another exemplary NMOS ESD device in accordance with the present invention.
Figure 4B:
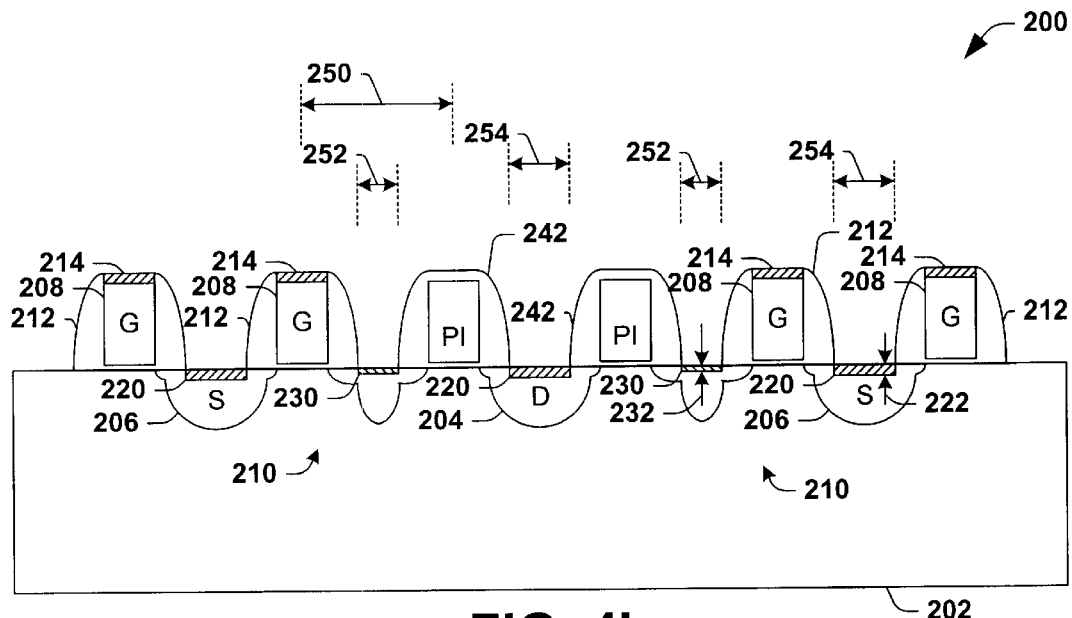
Figure 4C:
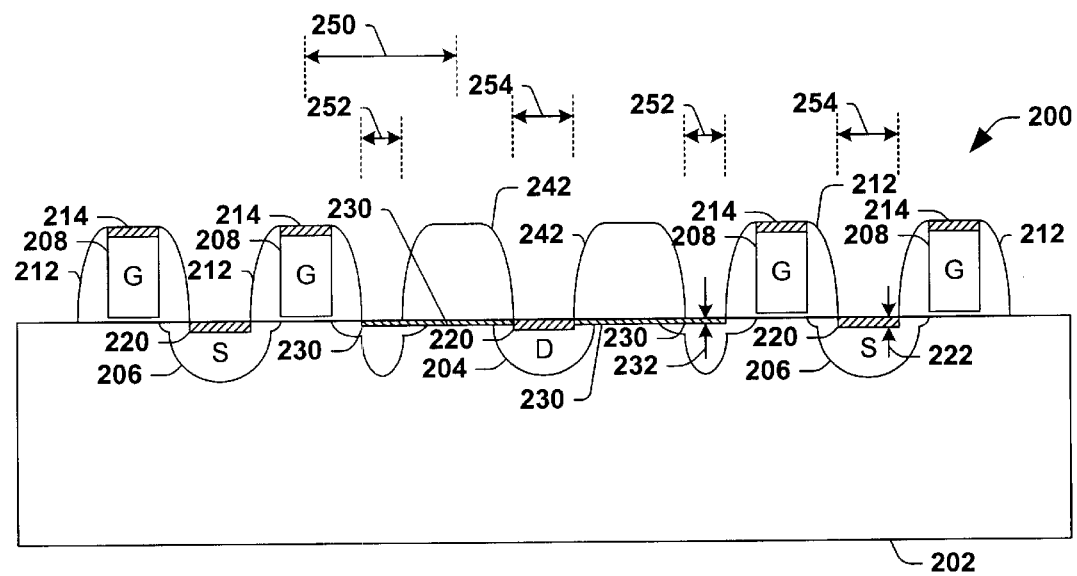

Another exemplary implementation of one or more aspects of the present invention is illustrated in FIGS. 4a–4c, in which an NMOS ESD protection device 200 is constructed from a P-type substrate 202. In this implementation, polysilicon island structures are formed between a drain region and polysilicon gate structures for use as a silicide-forming metal deposition mask. The islands are spaced from the polysilicon gates to provide narrow gaps for controlling the depth of silicide-forming metal deposited thereon. The deposited silicide-forming metal depth, in turn affects the resulting silicide thickness after the silicide-forming metal and silicon substrate are reacted. The device 200 comprises one or more N-type drain and source regions 204 and 206, respectively, as well as one or more gates 208 overlying P-type channel regions 210 between the drain and source regions 204 and 206. First silicide regions 220 are formed in the drain and source regions 204 and 206, having a first thickness 222 of about 30 nm or more. Second silicide regions 230 are formed in the substrate 202 between the gates 208 and the drain and source regions 204 and 206, which are thinner than the first silicide regions 220, for example, having a second thickness 232 of about 13 nm or more and about 25 nm or less, such as about 13 nm.

The gates 208 comprise first polysilicon structures 212 overlying the channel regions 210, and conductive contacts 214. The device 200 also includes second polysilicon structures or islands 242 on the substrate 200, wherein the first and second polysilicon structures 212 and 242 mask silicide-forming metal deposition in order to facilitate creation of the thin silicide regions 230. The polysilicon island structures 242 partially overly the drain region 204 between the gates 208 and the drain region 204. The spacings 252, 254 between the polysilicon structures 212, 242 can be employed to achieve selective control over the silicide thicknesses 222 and 232, and in particular, to provide thin silicide regions 230 and thicker silicide regions 220 using the same silicide-forming metal deposition and tempering operations. Moreover, the individual polysilicon islands 242 are spaced from one another to extend the thin silicide regions 230 therebetween. In this regard, it is noted that the polysilicon island structures 242 are illustrated in FIG. 4c in the background, and do not lie along section line 4c—4c of FIG. 4a.

The polysilicon regions 212 and 242 are spaced accordingly by a center to center distance 250 of about 270 nm or less to provide gaps of distance 252 therebetween, wherein the gap distances 252 are about 50 nm or less. Larger gap distances 254 are provided between adjacent first polysilicon structures 212 for the gates 208 and between adjacent second polysilicon island structures 242. The structures 212 extend along a width of the device 200 between first and second ends 260 and 262, respectively, and between the source and drain regions 206 and 204, respectively. In addition, the second polysilicon structures 242 extend along the width of the device between the ends 260, 262 and between the first polysilicon structures 212 and the drain region 204. In this implementation, the thin silicide regions 230 extend between the polysilicon structures 212 and the island structures 242, as well as between adjacent polysilicon island structures 242. It is noted that no NWELL is employed in the device 200, as the thin silicide regions 230 extend between adjacent polysilicon islands 242 to connect the thin silicide 230 to the drain region 204.

Thus, the invention employs thin silicide regions (e.g., regions 130 and 230 above) to increase the It2 ESD current capability, and/or to ensure timely turn on of multi-finger devices by setting Vt2 greater than Vt1. In this regard, the areas of thin silicide 230 between adjacent polysilicon island structures 242 form lateral resistances between the drain 204 and the gates 208. As such, the lengths of these resistances, and hence the resistance of the drain during ESD events can be adjusted through adjustment of the lateral widths of the island structures 242. Thus, for example, an increase in the resistances causes a corresponding increase in Vt2 for a given failure current It2. This adjustability in drain resistance, in turn, allows Vt2 to be set above Vt1 for the device 200, by which the uniformity in turning on all LNPNs (e.g., fingers) of the device 200 can be improved.

Furthermore, as described above with respect to the ESD clamping devices of FIGS. 3–4, the polysilicon structures (e.g., dummy gates of FIGS. 3a and 3b, or the polysilicon islands of FIGS. 4a–4c) and the gaps or spacings therebetween can be advantageously employed to selectively provide thin silicide regions in the protection devices without employing additional process steps and/or masks. It will be appreciated that the selective provision of thin silicide regions can be accomplished in many other ways, and through other structures apart from those illustrated sand described herein within the scope of the present invention. In addition, it is noted that the invention provides for such thin silicide regions between gate and drain regions, and/or between gate and source regions. Moreover, the thin suicide may be employed in ESD protection devices used in local clamping as well as rail based protection configurations.

Figure 5A:
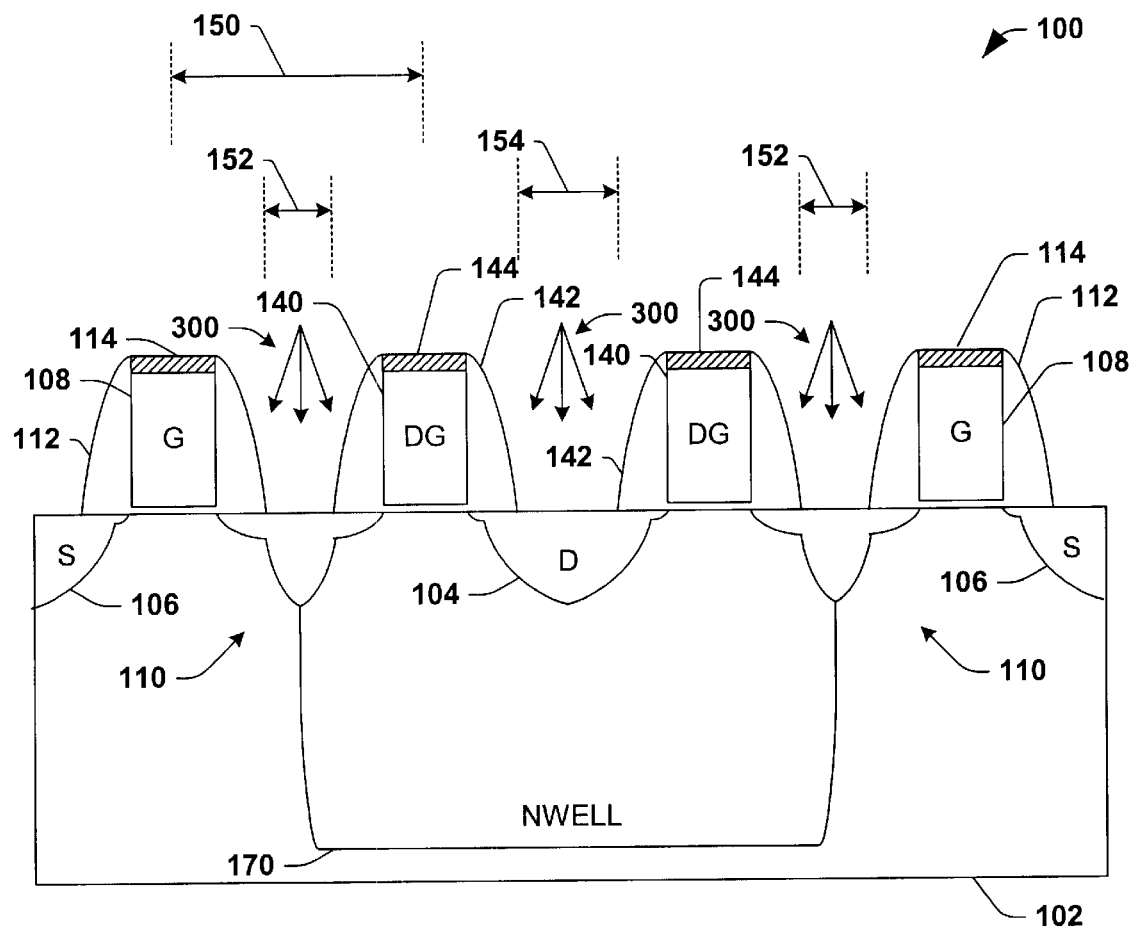
FIG. 5a is a side elevation view of an NMOS device illustrating silicide-forming metal deposition on the sides of a dummy gate in accordance with the invention.

As indicated above, the thickness of silicide regions in the NMOS ESD protection devices can be advantageously controlled to improve the ESD current capacity, and also to ensure proper transition into the snapback region for the LNPN. Referring now to FIG. 5a, a portion of the ESD clamping device 100 of FIGS. 3a and 3b is illustrated, including two gates 108, two dummy gates 140, the drain region 104 and portions of source regions 106, which are formed in the substrate 102 using known techniques. The polysilicon structures 112 and 142 are spaced from one another by a center to center distance 150 (e.g., about 270 nm or less) resulting in a small gap distance 152 therebetween, and the two adjacent dummy gate polysilicon structures 142 provide a wider gap distance 154 over the drain region 104. The polysilicon structures 112 and 142 can be formed by any photolithographic techniques such as are known in the art.

Thereafter, silicide formation is, performed to create thin silicide regions in the gaps between the structures 112 and 142, as well as thicker silicide in the gap between the adjacent structures 142. The silicide formation may thus comprise multiple formation steps or phases, for individually forming the thin and thick silicide regions, or alternatively may be accomplished using a single silicide formation, wherein selective masking techniques facilitate simultaneous formation of silicide regions having different thicknesses, in accordance with another aspect of the invention. For example, as illustrated in FIG. 5a, the silicide formation begins with a metal deposition operation 300, such as a silicide-forming metal deposition, for example, using cobalt. The deposition 300 comprises sputtering silicide-forming metal material onto the substrate 102, wherein polysilicon gates and dummy gates act as a silicide-forming metal deposition mask. The sputtering process is omni-directional, wherein the deposition occurs at various angles with respect to the surface of the substrate 102.

Figure 5B:
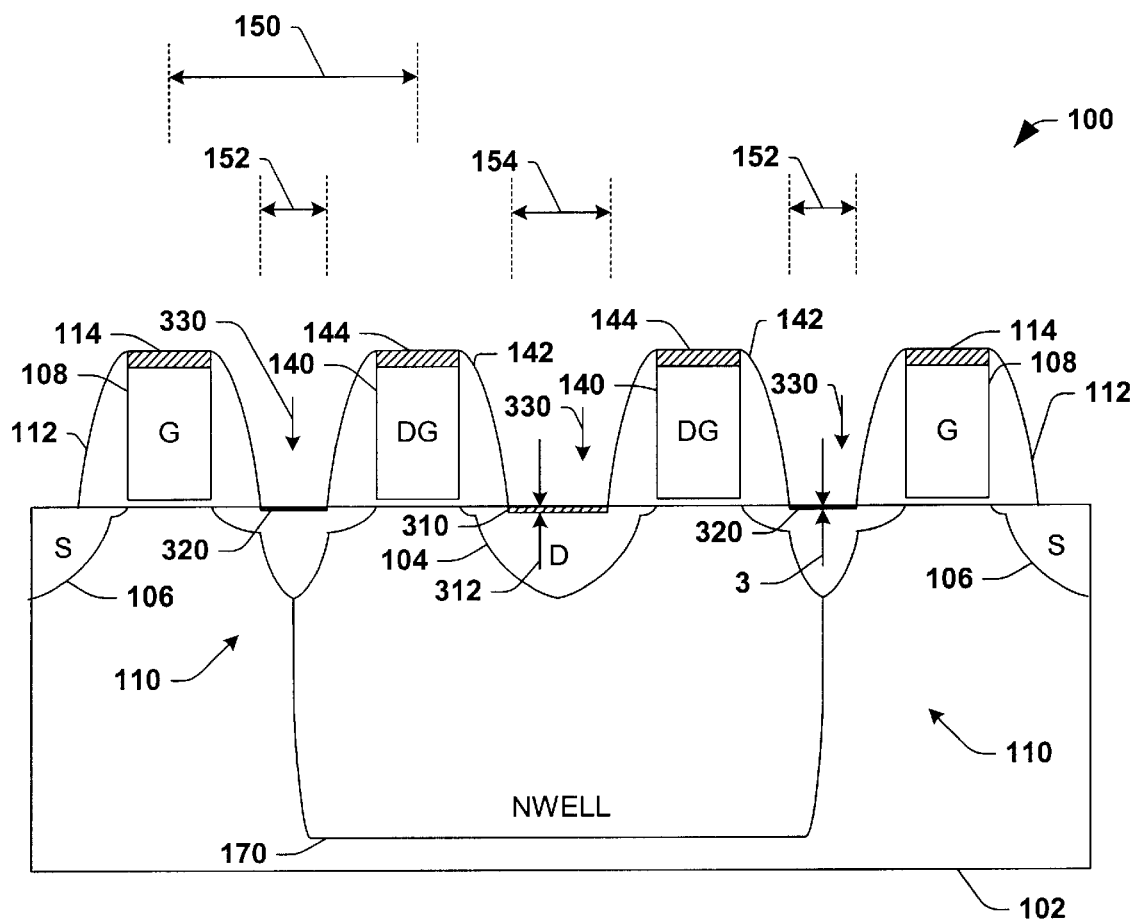
FIG. 5b is a side elevation view of the NMOS device of FIG. 5a illustrating processing of deposited silicide-forming metal on the sides of a dummy gate for formation of silicide in accordance with the invention.
Figure 5C:
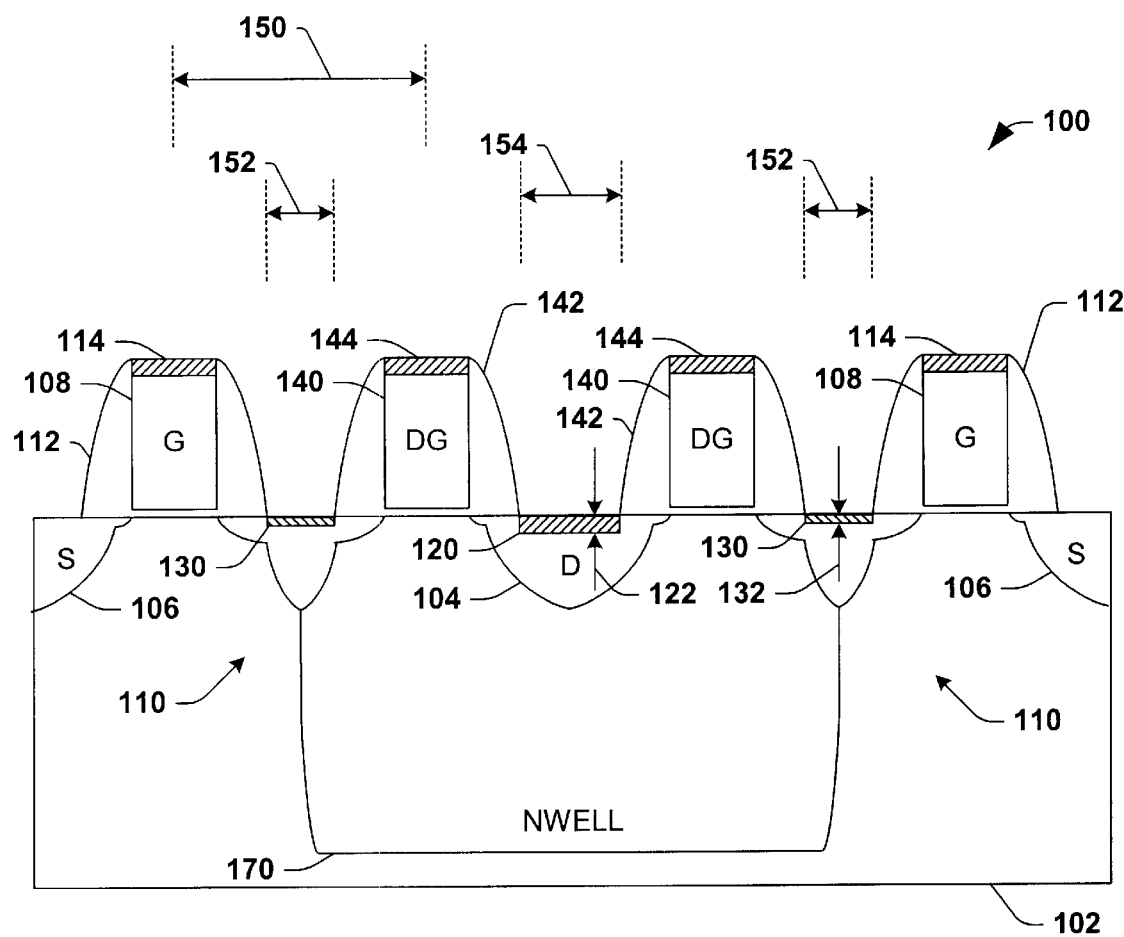
FIG. 5c is a side elevation view of the NMOS device of FIGS. 5a and 5b illustrating selectively formed thin silicide on the sides of a dummy gate in accordance with the invention.
Figure 5D:
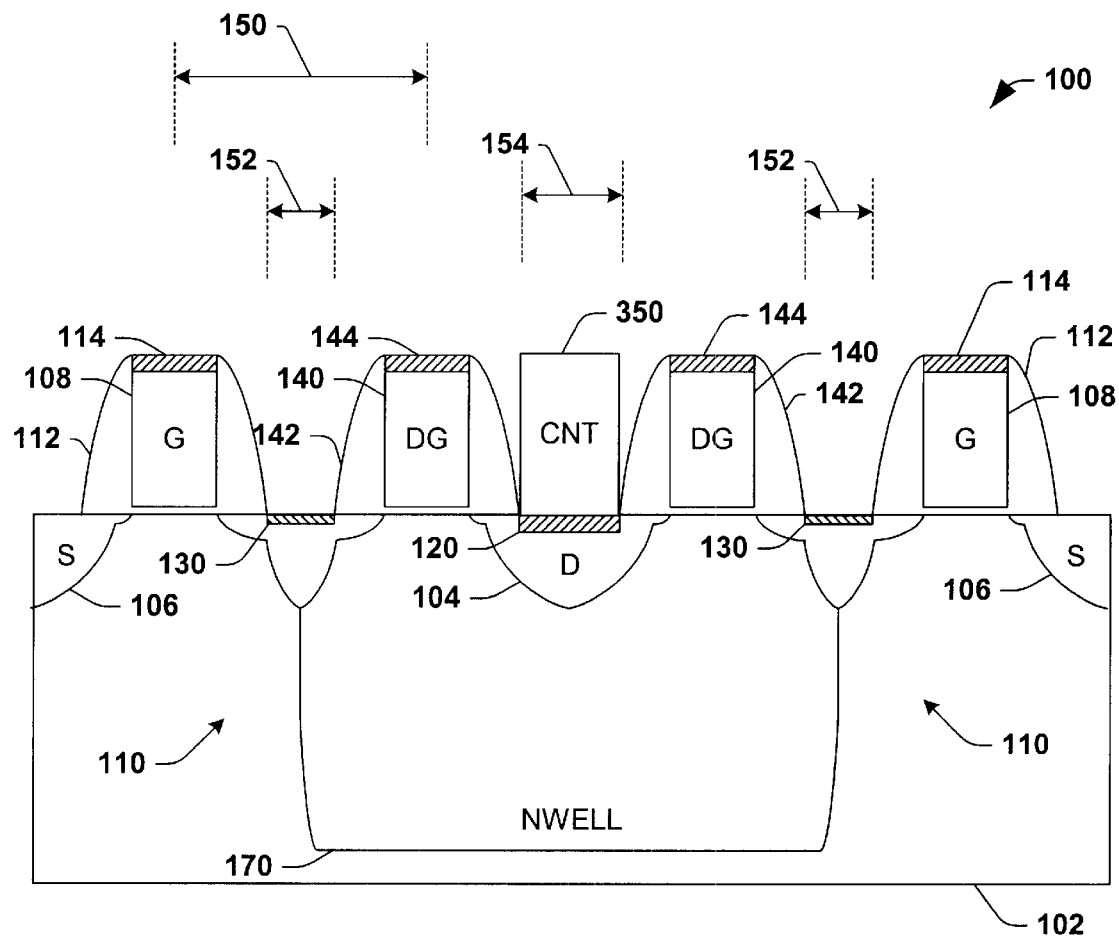
FIG. 5d is a side elevation view of the NMOS device of FIGS. 5a–5c illustrating the addition of conductive contacts to the drain region.

Referring also to FIGS. 5b and 5c, the omni-directional nature of the silicide-forming metal deposition process 300 results in more silicide-forming metal material in the wider gap between the adjacent polysilicon structures 142, than in the narrower gaps between the structures 112 and 142. Thus, the deposition 300 deposits silicide-forming metal material 310 between the adjacent structures 142 overlying the drain 104, having a thickness 312 of about 90 angstroms or more. In addition, the process 300 provides silicide-forming metal material 320 on the substrate 102 having a thickness 322 of about 55 angstroms or less between the structures 112 and 142. Thereafter, a sintering process 330 is applied to the deposited silicide-forming metal 310 and 320 to form suicides 120 and 130, respectively, having different thicknesses, as shown in FIG. 5c. Subsequent etching steps (not illustrated) can be employed to remove any unreacted metal (e.g., silicide-forming metal) while leaving the first silicide region 120 over the drain with a thickness 122 of about 30 nm or more, and the second silicide regions 130 with a thickness 132 of about 13 nm or more and about 25 nm or less, such as about 13 nm. As illustrated in FIG. 5d, contacts 350 may thereafter be added to the device 100 for electrical connection of the drain 104.

The invention thus provides for NMOS ESD protection devices wherein thin silicide regions are formed in order to provide improved It2 and consistent multi-finger turn on performance. In addition, the invention comprises methods for fabricating such devices on a semiconductor substrate. For example, the invention provides for formation of gate, drain, and source regions in the substrate, and formation of thin silicide regions in selected areas of the device to improve It2 and multi-finger device performance. The methodology of the invention comprises forming a first silicide region in the drain and/or the source region of the substrate having a first thickness, and a second silicide region in the substrate between the gate and the drain and/or source regions, having a second thickness less than the first thickness. The formation of the first and second silicide regions can be done in a single silicide formation operation, wherein masking can be used to selectively form silicides of various thicknesses.

The illustrated ESD clamping devices 100 and 200 are examples of devices and structures which can be created using the methodologies of the present invention. However, it will be appreciated that other devices can be made in accordance with the methods of the invention, and further that the devices illustrated and described herein can be fabricated according to methodologies not illustrated or described herein.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with", or variants thereof are used in either the detailed description or the claims, such terms are intended to be inclusive in a manner similar to the term "comprising."

What is claimed is:

1. An NMOS ESD clamping device for protecting an integrated circuit from an ESD event, comprising:
   N type drain and source regions formed in a semiconductor substrate;
   a gate overlying a P-type channel region in the substrate between the source and drain regions;
   a first silicide region formed in one of the drain and source regions of the substrate and having a first thickness; and
   a second silicide region formed in the substrate between the gate and the one of the drain and source regions and having a second thickness, wherein the first thickness is greater than the second thickness.

2. The device of claim 1, wherein the second thickness is about 13 nm or more and about 25 nm or less.

3. The device of claim 1, wherein the first thickness is about 30 nm or more and wherein the second thickness is about 25 nm or less.

4. The device of claim 3, wherein the second thickness is about 13 nm.

5. The device of claim 1, wherein the gate comprises a first polysilicon structure overlying the channel region, and wherein the device comprises a second polysilicon structure overlying the substrate and formed between the gate and the one of the drain and source regions.

6. The device of claim 5, wherein the second silicide region extends between the first and second polysilicon structures.

7. The device of claim 5, further comprising a first end and a second end, wherein the first polysilicon structure extends along a width of the device between the first and second ends and between the source and drain regions, and wherein the second polysilicon structure extends along the width of the device between the first arid second ends and between the first polysilicon structure and the one of the drain and source regions.

8. The device of claim 7, wherein the second polysilicon structure comprises a plurality of polysilicon islands located along a line between the first and second ends and spaced from one another and from the first polysilicon structure.

9. The device of claim 8, wherein the second silicide region extends between the first and second polysilicon structures and between adjacent polysilicon islands.

10. The device of claim 9, wherein the second thickness is about 13 nm or more and about 25 nm or less.

11. The device of claim 1, wherein the first thickness is about 30 nm or more and wherein the second thickness is about 25 nm or less.

12. The device of claim 11, wherein the second thickness is about 25 nm or less.

13. The device of claim 12, wherein the second thickness is about 13 nm.

14. An integrated circuit, comprising:
    a substrate with at least one pad for electrical interconnection of an I/O circuit with an external circuit;
    said I/O circuit formed in the substrate and electrically connected to the at least one pad; and
    an NMOS ESD clamping device electrically connected to the at least one pad for protecting the I/O circuit from an ESD event, comprising:
    N-type drain and source regions formed in a semiconductor substrate;
    a gate overlying a P-type channel region in the substrate between the source and drain regions;
    a first silicide region formed in one of the drain and source regions of the substrate and having a first thickness; and
    a second silicide region formed in the substrate between the gate and the one of the drain and source regions and having a second thickness less than the first thickness.

15. The integrated circuit of claim 14, wherein the second thickness is about 13 nm or more and about 25 nm or less.

* * * * *